(12) United States Patent
Huang

(10) Patent No.: US 7,986,185 B2
(45) Date of Patent: Jul. 26, 2011

(54) RAIL-TO-RAIL MILLER COMPENSATION METHOD WITHOUT FEED FORWARD PATH

(75) Inventor: Junwei Huang, Chengdu (CN)

(73) Assignee: IPGoal Microelectronics (SiChuan) Co., Ltd., High-Tech Incubation Park, Chengdu, Sichuan Province (CN)

( * ) Notice: Subject to any disclaimer, the term of this patent is extended or adjusted under 35 U.S.C. 154(b) by 0 days.

(21) Appl. No.: 12/793,657

(22) Filed: Jun. 3, 2010

(65) Prior Publication Data

US 2011/0043288 A1 Feb. 24, 2011

(30) Foreign Application Priority Data

Aug. 19, 2009 (CN) .......................... 2009 1 0060379

(51) Int. Cl.
*H03F 1/24* (2006.01)
(52) U.S. Cl. ........................... 330/98; 330/311; 330/292
(58) Field of Classification Search .................. 330/292, 330/310–311, 98, 133, 150, 76
See application file for complete search history.

(56) References Cited

U.S. PATENT DOCUMENTS

| 5,854,573 | A | * | 12/1998 | Chan | 330/292 |
| 7,633,338 | B1 | * | 12/2009 | Aram | 330/98 |
| 7,724,080 | B2 | * | 5/2010 | Luff | 330/9 |

* cited by examiner

*Primary Examiner* — Hieu P Nguyen

(57) ABSTRACT

A rail-to-rail Miller compensation method without feed forward path includes forming a first compensation branch including a first amplifier, wherein an input of the first amplifier is electrically connected with an output of a second stage gain amplifier, the second stage gain amplifier is electrically connected the first stage gain amplifier in series forming an operational amplifier; and forming a second compensation branch including a second amplifier, wherein a dual relation is provided between an input stage of the first amplifier and that of the second amplifier, namely, if the input stage of the first amplifier is N-type, the input stage of the second amplifier is P-type, and vice versa. The present invention is capable of achieving the rail-to-rail output range without affecting the system stability. The N-type and P-type inputs are simultaneously applied to the input of the amplifier of the compensation branches.

20 Claims, 2 Drawing Sheets

US 7,986,185 B2

RAIL-TO-RAIL MILLER COMPENSATION METHOD WITHOUT FEED FORWARD PATH

BACKGROUND OF THE PRESENT INVENTION

1. Field of Invention

The present invention relates to an operational amplifier field, and more particularly to a rail-to-rail Miller compensation method without feed forward path.

2. Description of Related Arts

Operational amplifier is usually basic components of a signal processing and feedback system, the stability of which affects the system performance. The basic elements constituting an operational amplifier have parasitic capacitance or inductance, so the output of the operational amplifier will produce a phase shift relative to the input thereof. For an ordinary two-stage operational amplifier, its transfer function can be expressed as follows:

$$H(s)=Av/(s+p1)*(s+p2),$$

wherein Av is the DC gain, p1 is the dominant pole, p2 is the secondary pole. The gain decreases by 20 dB/10 oct at every pole, and finally a 90-degree phase shift is produced at every pole. When the operational amplifier is applied to the negative feedback control system, the gain of the transfer function varies with the frequency, if before the unity gain, the phase shift caused by the pole is larger than 180-degree, then the system will oscillate, that is to say, be unstable. In general, a stable system should have a phase shift smaller than 135-degree when the gain reaches unity, it can also be said that the stable system needs at least 45-degree of phase margin.

To get a stable system, the frequency compensation is often introduced. The most common compensation method for a two-stage operational amplifier is Miller compensation, as shown in FIG. 1, wherein GM1 is the first gain stage transconductance amplifier, GM2 is the second gain stage transconductance amplifier, R1 is the first gain stage output resistor, RL is the load resistor, CL is the load capacitor, CC is the Miller capacitor. The main principle is that the first pole is separated from the second pole, even if the first pole reaches a lower frequency, the second pole will not be in the range of unity gain bandwidth. The first pole of the circuit as shown in FIG. 1 can be expressed as:

$$p1=1/(2*pi*R1*GM2*RL*CC)$$

$$p2=GM2/(2*pi*CL)$$

At the same time, a right half plane zero will be produced because of the feed forward effect of CC:

$$Z=-GM2/CC$$

The phase shift of 90-degree produced by the right half plane zero will affect the system stability. In order to reduce its impact, the GM2 is increased, that is to say, the output current is increased, thus leading to the increase of the power consumption. There are a lot of methods for eliminating the impact of the right half plane zero. The first method is adding a resistor connected with the CC in series. The second method can also prevent the feed forward, as shown in FIG. 2.

Referring to FIG. 2, an amplifier +A is electrically connected with the CC at X. Owing to the unidirectional transmission of the amplifier, the CC is only provided on the feedback path, and no feed forward path forms. Therefore, the feed forward path is effectively eliminated, and the right half plane zero is also eliminated.

In FIG. 2, the input end of the amplifier +A is generally electrically connected with the P-type or N-type devices. FIG. 3 shows two general structure of the amplifier +A. When the amplifier +A is shown as FIG. 3(a), to insure a proper function of amplifier +A, the voltage swing at the "OUT" node should be from VGS(M1)+VDSAT(M2) to VDD. Similarly, if the amplifier +A is shown as FIG. 3(b), to insure a proper function of amplifier +A, the voltage swing at the "OUT" node should be from GND to VDD−VGS(M4)−VDSAT(M3). As a result, the output voltage swing at the "OUT" node can not be the rail-to-rail. Once the output voltages at the "OUT" node exceeds the range of VGS(M1)+VDSAT(M2) to VDD and GND to VDD-VGS(M4)-VDSAT(M3), in FIG. 3(a) and FIG. 3(b) respectively, the amplifier +A will not work properly, thus the compensation will fail.

SUMMARY OF THE PRESENT INVENTION

The objective of the present invention is to provide a Miller compensation method without feed forward path, which is capable of achieving rail-to-rail output range without affecting system stability.

In order to accomplish the above objective, the present invention provides a rail-to-rail Miller compensation method without feed forward path, comprising:

forming a two-stage amplification signal main signal path comprising a first stage gain amplifier and a second stage gain amplifier electrically connected with the first stage gain amplifier in series;

forming a first compensation branch comprising a first amplifier, wherein an input of the first amplifier is electrically connected with an output of the second stage gain amplifier;

forming a second compensation branch comprising a second amplifier, wherein an input of the second amplifier is electrically connected with the output of the second stage gain amplifier, wherein the input stage of the first amplifier has a dual relationship with that of the second amplifier, that is to say, if the input stage of the first amplifier is N-type, then the input stage of the second amplifier is P-type; and if the input stage of the first amplifier is P-type, then the input stage of the second amplifier is N-type.

The first stage gain amplifier is made up of a first gain stage transconductance amplifier GM1 and a first gain stage output resistor R1, and the second stage gain amplifier is made up of a second gain stage transconductance amplifier GM2 and a second gain stage output resistor RL.

According to the two compensation branches mentioned above, when the output of the operational amplifier GM2 is high, the P-type input compensation branch will not work, and the N-type input compensation branch will work. When the output of the operational amplifier GM2 is low, the N-type input compensation branch will not work, and the P-type input compensation branch will work. When the output of the operational amplifier GM2 is in middle range, both the N-type input and the P-type input compensation branches will work simultaneously, thus ensuring the compensation function in a rail-to-rail output range of GM2.

For a traditional compensation method without feed forward path, only a P-type input or N-type input amplifier +A is provided, the input of which is the output of the operational amplifier, and an output of which is electrically connected with a compensation capacitor CC. When the output of the operational amplifier is high or low, the P-type input or N-type input amplifier +A will not work properly, thus the compensation function is failed. Therefore, in order to stabilize the output of the operational amplifier under high or low voltage (namely the rail-to-rail output range), another compensation branch is needed based on the original compensation.

A first compensation capacitor CC1 is provided between an output of the first stage gain amplifier and an output of the first amplifier A1, similarly, a second compensation capacitor CC2 is provided between an output of the first stage gain amplifier and an output of the second amplifier A2. An input of the first amplifier A1 is an output of the operational amplifier. Similarly, an input of the second amplifier A2 is the output of the operational amplifier. The output of the first amplifier A1 is electrically connected with one end of the first compensation capacitor CC1, the other end of the first compensation capacitor CC1 is electrically connected with the output of the first stage gain amplifier. The input of the second amplifier A2 is electrically connected with the output of the second stage gain amplifier. The output of the second amplifier A2 is electrically connected with one end of the second compensation capacitor CC2, and the other end of the second compensation capacitor CC2 is electrically connected with the output of the first stage gain amplifier.

The P-type input and N-type input can be formed as various MOS devices or bipolar devices.

The beneficial effects of the present invention are illustrated as follows.

The present invention provides a Miller compensation method without feed forward path which is capable of achieving the rail-to-rail output range without affecting system stability. In this method, the N-type input and P-type input amplifiers are provided simultaneously.

These and other objectives, features, and advantages of the present invention will become apparent from the following detailed description, the accompanying drawings, and the appended claims.

DETAILED DESCRIPTION OF THE PREFERRED EMBODIMENT

Figure 4:
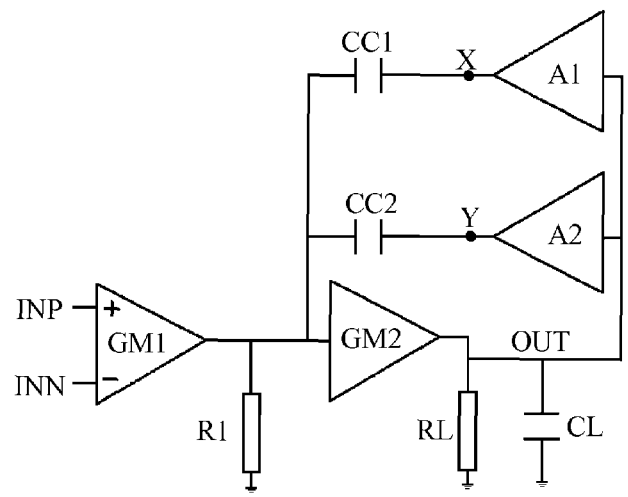
FIG. 4 is a schematic view of a rail-to-rail Miller compensation method without feed forward path according to a preferred embodiment of the present invention.

Referring to FIG. 4, a rail-to-rail Miller compensation method without feed forward path according to a preferred embodiment of the present invention is illustrated, which comprises forming a first compensation branch comprising a first amplifier A1, and forming a second compensation branch comprising a second amplifier A2.

A first stage gain amplifier and a second stage gain amplifier are provided in the present invention. An input end of the first amplifier A1 is electrically connected with an output end of the second stage gain amplifier. A dual relation is provided between an input stage of the second amplifier A2 and that of the first amplifier A1, that is to say, if the input stage of the first amplifier A1 is N-type, the input stage of the second amplifier A2 is P-type; if the input stage of the first amplifier A1 is P-type, the input stage of the second amplifier A2 is N-type.

The first stage gain amplifier is electrically connected with the second stage gain amplifier in series, thus forming an operational amplifier.

The first stage gain amplifier is made up of the first gain stage transconductance amplifier GM1 and the first gain stage output resistor R1. The second stage gain amplifier is made up of the second gain stage transconductance amplifier GM2 and the second gain stage output resistor RL.

According to the two compensation branches mentioned above, when the output of the operational amplifier is high, the P-type input amplifier will not work, and the N-type input amplifier will work. When the output of the operational amplifier is low, the N-type input amplifier will not work, and the P-type input amplifier will work. When the output of the operational amplifier is middle, the N-type input amplifier and the P-type input amplifier will simultaneously work, thus ensuring the compensation function.

Figure 1:
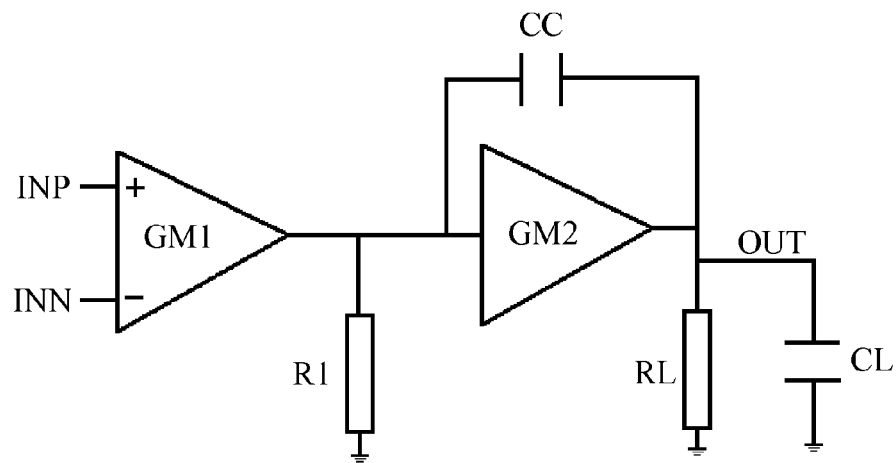
FIG. 1 is a circuit diagram of a conventional Miller compensation circuit.
Figure 2:
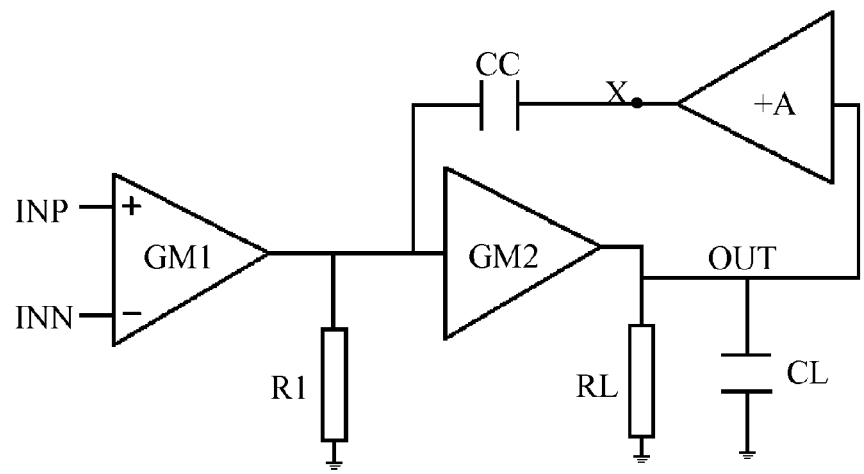
FIG. 2 is a circuit diagram of another conventional Miller compensation circuit.
Figure 3:
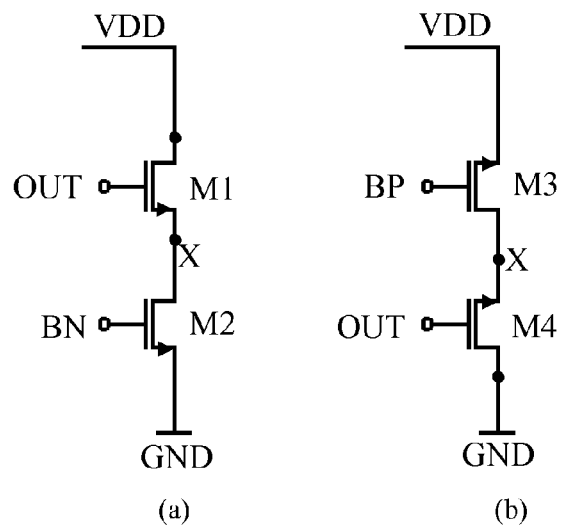
FIG. 3 is two common circuit diagrams of the conventional amplifier +A.

As shown in FIG. 2, a traditional compensation method without feed forward path is illustrated, wherein only a P-type input or N-type input amplifier +A is provided, the input of which is the output of the operational amplifier, and an output of which is electrically connected with a compensation capacitor CC. When the output of the operational amplifier is high or low, the P-type input or N-type input amplifier +A will not work properly, thus the compensation function is failed. Therefore, in order to stabilize the output of the operational amplifier under high or low voltage (namely the rail-to-rail output range), another compensation branch is needed based on the original compensation.

A first compensation capacitor CC1 is provided between an output of the first stage gain amplifier and an output of the first amplifier A1, similarly, a second compensation capacitor CC2 is provided between an output of the first stage gain amplifier and an output of the second amplifier A2. An input of the first amplifier A1 is electrically connected with an output of the operational amplifier. Similarly, an input of the second amplifier A2 is electrically connected with the output of the operational amplifier. The output of the first amplifier A1 is electrically connected with one end of the first compensation capacitor CC1, the other end of the first compensation capacitor CC1 is electrically connected with the output of the first stage gain amplifier. The input of the second amplifier A2 is electrically connected with the output of the second stage gain amplifier. The output of the second amplifier A2 is electrically connected with one end of the second compensation capacitor CC2, and the other end of the second compensation capacitor CC2 is electrically connected with the output of the first stage gain amplifier.

The P-type input or N-type input can be formed as various MOS devices or bipolar devices.

Figure 5:
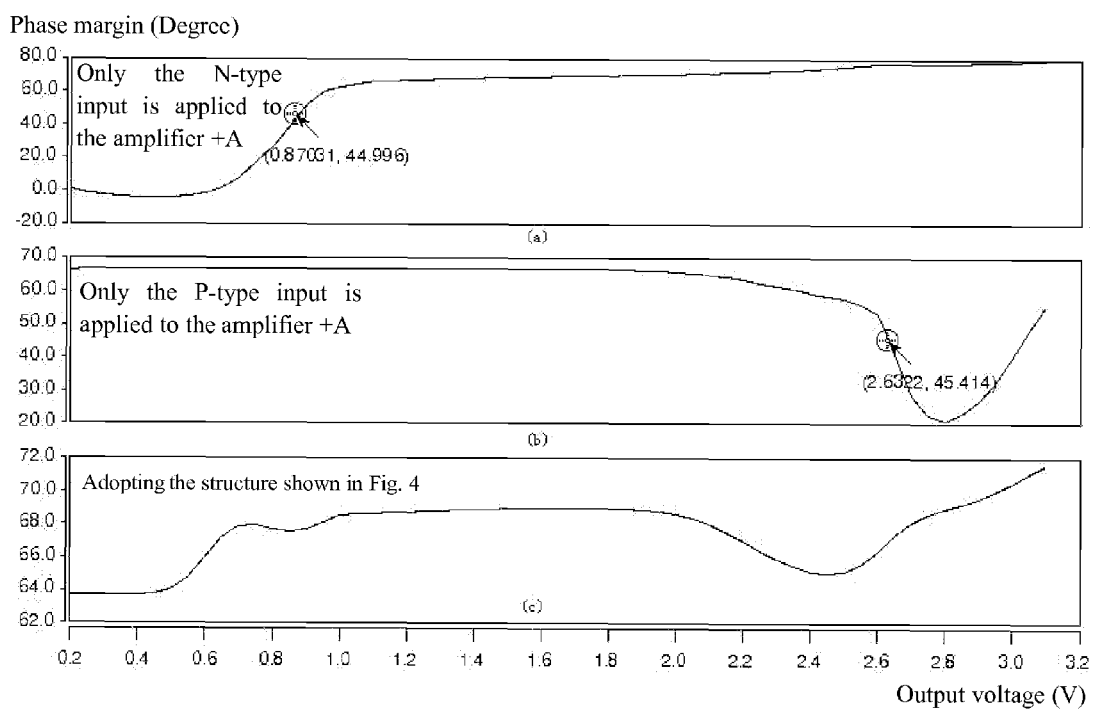
FIG. 5 is a frequency response Bode plot of 0.5V output according to the above preferred embodiment of the present invention.

Referring to FIG. 5, FIG. 5(a) illustrates the phase margin only the N-type input is applied to the amplifier +A shown in FIG. 2, wherein when the output voltage is lower than 0.87V, the phase margin will be lower than 45-degree. FIG. 5(b) illustrates the phase margin only the P-type input is applied to the amplifier +A shown in FIG. 2, wherein when the output voltage is higher than 2.63V, the phase margin will be lower than 45-degree. FIG. 5(c) illustrates the phase margin of the present invention, wherein when the output voltage is from 0.2V to 3.1V, the phase margin will keep more than 60-degree.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A rail-to-rail Miller compensation method without feed forward path, comprising:

forming a two-stage amplification signal main signal path comprising a first stage gain amplifier and a second stage gain amplifier electrically connected with the first stage gain amplifier in series thus forming an operational amplifier;

forming a first compensation branch comprising a first amplifier, wherein an input of the first amplifier is electrically connected with an output of the second stage gain amplifier; and forming a second compensation branch comprising a second amplifier, wherein a dual relation is provided between an input stage of the first amplifier and that of the second amplifier, that is to say, if the input stage of the first amplifier is N-type, the input stage of the second amplifier is P-type; if the input stage of the first amplifier is P-type, the input stage of the second amplifier is N-type.

2. The rail-to-rail Miller compensation method, as recited in claim 1, wherein the first stage gain amplifier is made up of a first gain stage transconductance amplifier and a first gain stage output resistor, and the second stage gain amplifier is made up of a second gain stage transconductance amplifier and a second gain stage output resistor.

3. The rail-to-rail Miller compensation method, as recited in claim 1, wherein the first compensation branch further comprises a first compensation capacitor provided between the output of the first stage gain amplifier and an output of the first amplifier, the second compensation branch further comprises a second compensation capacitor provided between the output of the first stage gain amplifier and an output of the second amplifier, the input of the first amplifier is electrically connected with the output of the operational amplifier, the input of the second amplifier is electrically connected with the output of the operational amplifier, the output of the first amplifier is electrically connected with one end of the first compensation capacitor, the other end of the first compensation capacitor is electrically connected with the output of the first stage gain amplifier, the input of the second amplifier is electrically connected with the output of the second stage gain amplifier, the output of the second amplifier is electrically connected with one end of the second compensation capacitor, and the other end of the second compensation capacitor is electrically connected with the output of the first stage gain amplifier.

4. The rail-to-rail Miller compensation method, as recited in claim 2, wherein the first compensation branch further comprises a first compensation capacitor provided between the output of the first stage gain amplifier and an output of the first amplifier, the second compensation branch further comprises a second compensation capacitor provided between the output of the first stage gain amplifier and an output of the second amplifier, the input of the first amplifier is an output of the operational amplifier, the input of the second amplifier is the output of the operational amplifier, the output of the first amplifier is electrically connected with one end of the first compensation capacitor, the other end of the first compensation capacitor is electrically connected with the output of the first stage gain amplifier, the input of the second amplifier is electrically connected with the output of the second stage gain amplifier, the output of the second amplifier is electrically connected with one end of the second compensation capacitor, and the other end of the second compensation capacitor is electrically connected with the output of the first stage gain amplifier.

5. The rail-to-rail Miller compensation method, as recited in claim 1, wherein the P-type input is formed as MOS or bipolar devices.

6. The rail-to-rail Miller compensation method, as recited in claim 1, wherein the N-type input is formed as MOS or bipolar devices.

7. The rail-to-rail Miller compensation method, as recited in claim 2, wherein the P-type input is formed as MOS or bipolar devices.

8. The rail-to-rail Miller compensation method, as recited in claim 2, wherein the N-type input is formed as MOS or bipolar devices.

9. The rail-to-rail Miller compensation method, as recited in claim 4, wherein the P-type input is formed as MOS or bipolar devices.

10. The rail-to-rail Miller compensation method, as recited in claim 4, wherein the N-type input is formed as MOS or bipolar devices.

11. A Miller compensation circuit, comprising:

a first stage gain amplifier;

a second stage gain amplifier;

a first compensation branch comprising a first amplifier, wherein an input of said first amplifier is electrically connected with an output of said second stage gain amplifier, an input of said second stage gain amplifier is electrically connected with an output of said first stage gain amplifier in series forming an operational amplifier; and a second compensation branch comprising a second amplifier, wherein a dual relation is provided between an input stage of said first amplifier and that of said second amplifier, that is to say, if said input stage of said first amplifier is N-type, said input stage of said second amplifier is P-type; if said input stage of said first amplifier is P-type, said input stage of said second amplifier is N-type.

12. The Miller compensation circuit, as recited in claim 11, wherein said first stage gain amplifier is made up of a first gain stage transconductance amplifier and a first gain stage output resistor, and said second stage gain amplifier is made up of a second gain stage transconductance amplifier and a second gain stage output resistor.

13. The Miller compensation circuit, as recited in claim 11, wherein said first compensation branch further comprises a first compensation capacitor provided between said output of said first stage gain amplifier and an output of said first amplifier, said second compensation branch further comprises a second compensation capacitor provided between said output of said first stage gain amplifier and an output of said second amplifier, said input of said first amplifier is an output of said operational amplifier, said input of said second amplifier is said output of said operational amplifier, said output of said first amplifier is electrically connected with one end of said first compensation capacitor, said other end of said first compensation capacitor is electrically connected with said output of said first stage gain amplifier, said input of said second amplifier is electrically connected with said output of said second stage gain amplifier, said output of said second amplifier is electrically connected with one end of said second compensation capacitor, and said other end of said second compensation capacitor is electrically connected with said output of said first stage gain amplifier.

14. The Miller compensation circuit, as recited in claim 12, wherein said first compensation branch further comprises a first compensation capacitor provided between said output of said first stage gain amplifier and an output of said first amplifier, said second compensation branch further comprises a second compensation capacitor provided between said output of said first stage gain amplifier and an output of said second amplifier, said input of said first amplifier is an output of said operational amplifier, said input of said second amplifier is said output of said operational amplifier, said output of said first amplifier is electrically connected with one end of said first compensation capacitor, said other end of said first compensation capacitor is electrically connected with said output of said first stage gain amplifier, said input of said second amplifier is electrically connected with said output of said second stage gain amplifier, said output of said second amplifier is electrically connected with one end of said second compensation capacitor, and said other end of said second compensation capacitor is electrically connected with said output of said first stage gain amplifier.

15. The Miller compensation circuit, as recited in claim 11, wherein said P-type input is MOS or bipolar devices.

16. The Miller compensation circuit, as recited in claim 11, wherein said N-type input is MOS or bipolar devices.

17. The Miller compensation circuit, as recited in claim 12, wherein said P-type input is MOS or bipolar devices.

18. The Miller compensation circuit, as recited in claim 12, wherein said N-type input is MOS or bipolar devices.

19. The Miller compensation circuit, as recited in claim 14, wherein said P-type input is MOS or bipolar devices.

20. The Miller compensation circuit, as recited in claim 14, wherein said N-type input is MOS or bipolar devices.

* * * * *